(12) United States Patent
Kaminski

(10) Patent No.: US 6,644,480 B2
(45) Date of Patent: Nov. 11, 2003

(54) ADJUSTABLE RACKMOUNT ASSEMBLY WITH LOCKING KEY

(75) Inventor: Joseph W. Kaminski, Campbell, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/060,574

(22) Filed: Jan. 30, 2002

(65) Prior Publication Data

US 2003/0141264 A1 Jul. 31, 2003

(51) Int. Cl.[7] .................................................. A47F 7/00
(52) U.S. Cl. ........................................................ 211/26
(58) Field of Search .......................... 211/26, 175, 190, 211/191, 189, 186

(56) References Cited

U.S. PATENT DOCUMENTS

| | | | | |
|---|---|---|---|---|
| 5,546,277 A | * | 8/1996 | Zandbergen | 361/726 |
| 5,571,256 A | * | 11/1996 | Good et al. | 211/26 |
| 5,791,498 A | * | 8/1998 | Mills | 211/26 |
| 6,021,909 A | | 2/2000 | Tang et al. | 211/183 |
| 6,230,903 B1 | | 5/2001 | Abbott | 211/26 |
| 6,422,399 B1 | * | 7/2002 | Castillo et al. | 211/26 |

* cited by examiner

Primary Examiner—Alvin Chin-Shue
Assistant Examiner—Sarah Purol

(57) ABSTRACT

An adjustable rackmount assembly is disclosed, including a first support member having a plurality of first longitudinal slots, a second support member having a plurality of second longitudinal slots, a longitudinally-extending tab arranged in each of the second longitudinal slots, and a key for engaging one of the tabs and securing the first support member adjacent to the second support member.

20 Claims, 3 Drawing Sheets

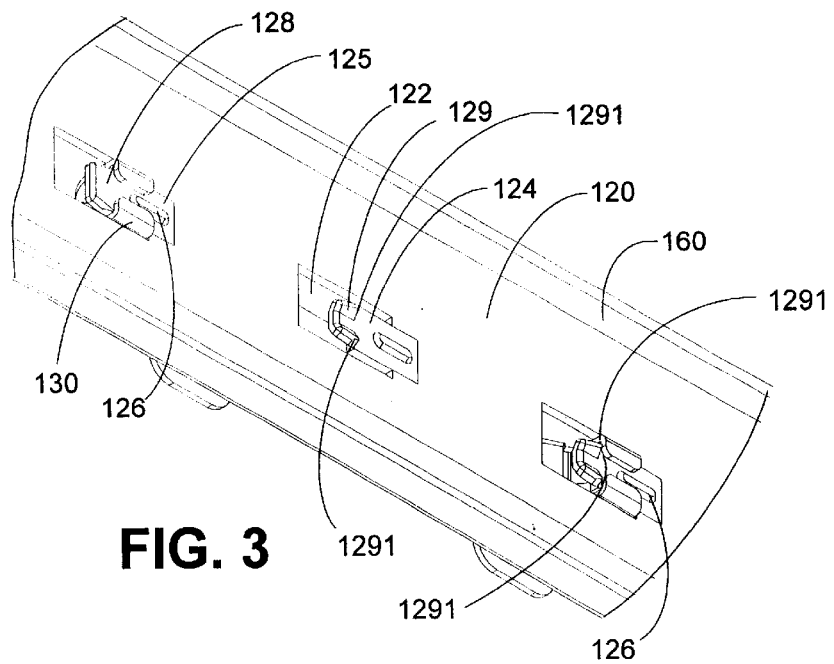
FIG. 3
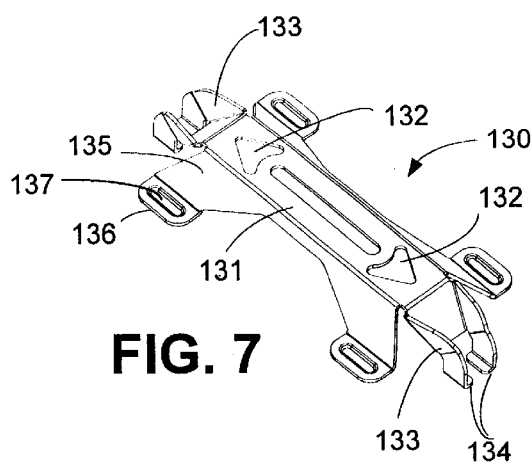
FIG. 7
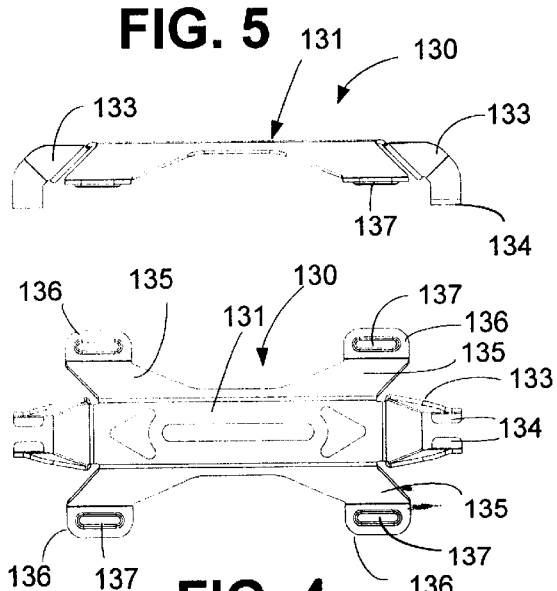
FIG. 5
FIG. 4
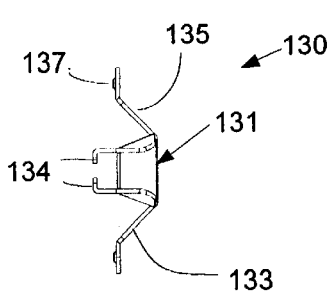
FIG. 6

ADJUSTABLE RACKMOUNT ASSEMBLY WITH LOCKING KEY

TECHNICAL FIELD

The subject matter disclosed here generally relates to racks, and more particularly, to an adjustable rackmount assembly with a locking key.

BACKGROUND

A "rack" is a frame or cabinet for holding other equipment, such as servers and/or other computer components. Most computer racks are between 24 and 42 "rack units" in height, with each rack unit being 1.75 inches. A standard rack is 19 inches wide; however, wider racks are also available. For example, Hewlett-Packard Company, of Palo Alto, Calif., offers various "NetServer" rack configurations including its line of "System/E" and "System/U" products. Each of these products has a width of approximately 23.5 inches and a depth of 36.5 inches. However, other commonly-used racks have different depths.

Various "rackmount kits" are also available from Hewlett-Packard in order to provide support members (including, but not limited to, racks and slides) for mounting various components inside its NetServer racks. For example, U.S. Pat. No. 6,021,909 to Tang et al. (and assigned at issuance to Hewlett-Packard Company) discloses a rail system for use in an equipment enclosure and is incorporated by reference here. Similarly, U.S. Pat. No. 6,230,903 to Abbot (also assigned at issuance to Hewlett-Packard Company) discloses a rack support rail system and is also incorporated by reference here. However, these conventional rackmount assemblies are limited to 36.5 inch deep rack configurations and can not be easily, or safely, used with racks having other depth dimensions.

SUMMARY

These and other drawbacks of conventional technology are addressed here by providing an adjustable rackmount assembly, including a first support member having a plurality of first longitudinal slots, a second support number having a plurality of second longitudinal slots, a longitudinally-extending tab arranged in each of the second longitudinal slots, and a key for engaging at least one of the tabs and securing the first support member adjacent to the second support member.

The technology described here also relates to a key for securing a first support member adjacent to a second support member of an adjustable rack mount assembly, the key including a torso; at least one pair of arms, extending from each side of the torso, for supporting the torso over the first support member; and at least one head, extending from an end of the torso, for slidably engaging the second support member through a hole in the first support member.

In yet another embodiment, the subject matter described here generally relates to a rack, including a base; at least two columns extending from the base; a first support member, having a plurality of first longitudinal slots, extending from one of the two columns; a second support member, having a plurality of second longitudinal slots, extending from another of the two columns; a tab extending from one end and into each of the longitudinal slots; and a key for securing the first support member adjacent to the second support member; where the key includes a torso; two heads, each head extending from opposite ends of the torso and through adjacent first longitudinal slots, for slidably engaging tabs in adjacent second longitudinal slots; two pairs of arms for supporting the torso over the first support member, each pair of arms arranged near opposite ends of the torso and each arm on one of the pairs extending from opposite sides of the torso; and a hand arranged at the end of each arm for abutting the surface of the first support member that faces away from the second support member.

BRIEF DESCRIPTION OF THE DRAWINGS

Various aspects of the invention will now be described with reference to the following figures ("FIGs.") which are not necessarily drawn to scale, but use the same reference numerals to designate corresponding parts throughout each of the several views.

FIG. 3 is an enlarged, partial isometric back view of the adjustable rack mount assembly shown in FIG. 1.

FIG. 4 is a top view of the key shown in FIGS. 1–3.

FIG. 5 is a side view of the key shown in FIG. 4.

FIG. 6 is an end view of the key shown in FIG. 4.

FIG. 7 is an isometric view of the key shown in FIGS. 4–6.

DETAILED DESCRIPTION OF THE PREFERRED EMBODIMENTS

Figure 1:
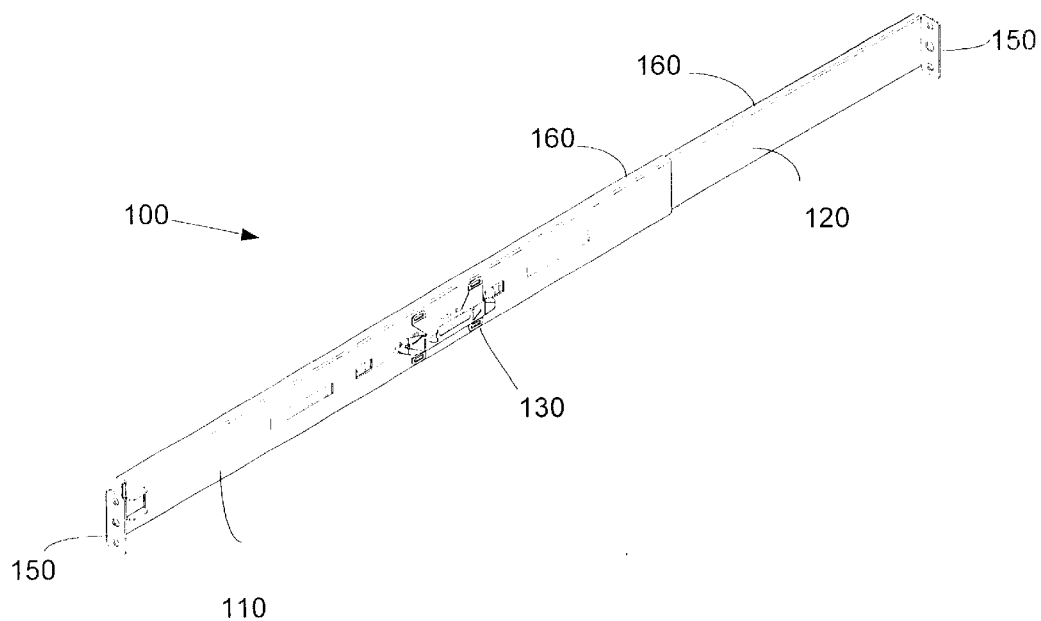
FIG. 1 is an assembled isometric view of one embodiment of an adjustable rackmount assembly.
Figure 2:
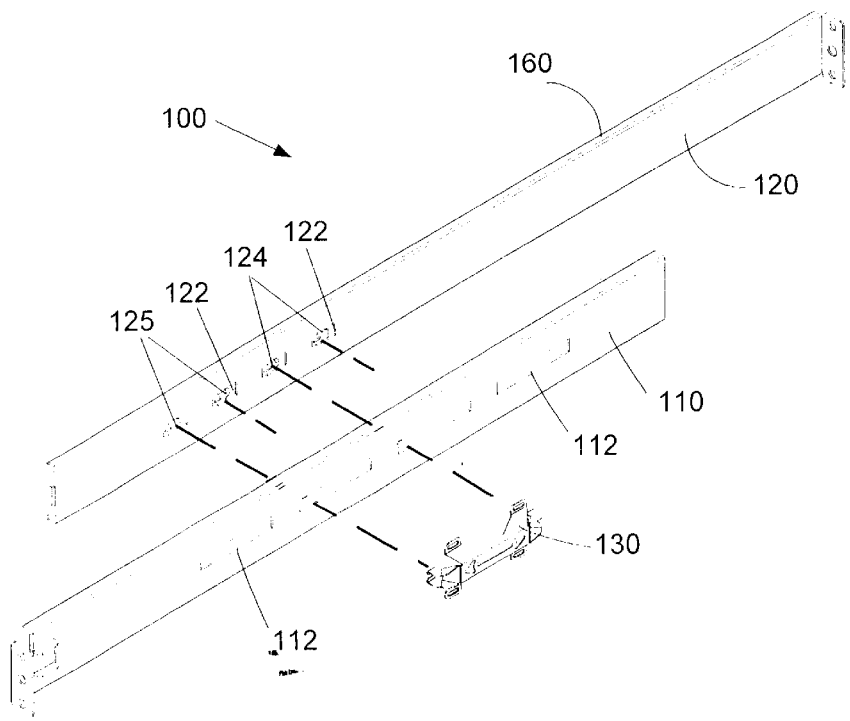
FIG. 2 is an exploded isometric view of the adjustable rackmount assembly shown in FIG. 1.
Figure 8:
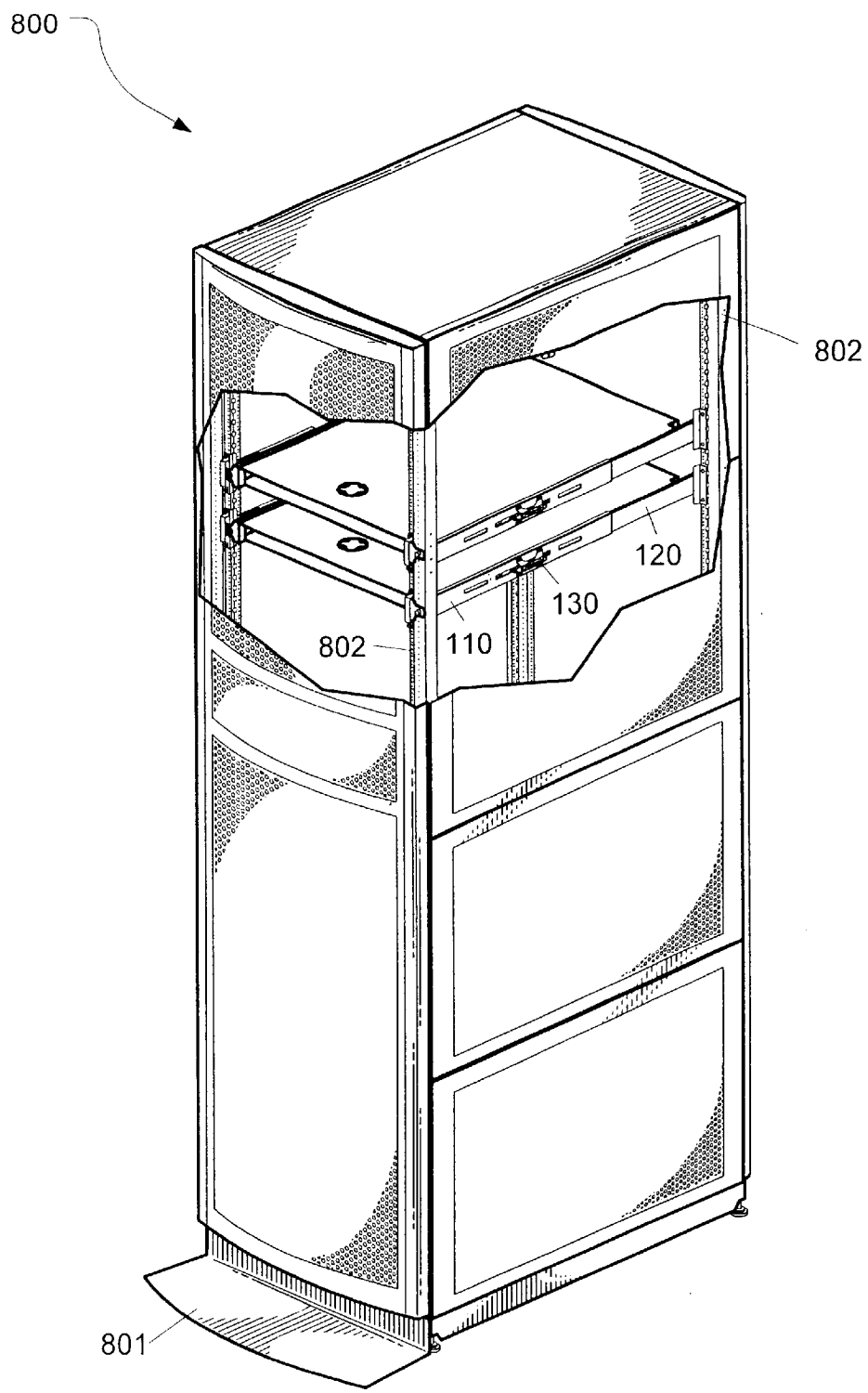
FIG. 8 is an isometric view of a rack including the rackmount assembly shown in FIGS. 1 and 2.

FIGS. 1 and 2 illustrate one embodiment of a continuously adjustable rackmount assembly 100. The term "assembly" is used here to describe a group of assembled or unassembled component parts, such as those shown in FIG. 2, that are configurable into a device, such as the one shown in FIG. 1. This term also refers to a process for configuring the parts into the assembled device that is generally referred to as a "rackmount" because it can be mounted in a "rack" frame or cabinet for holding other equipment, such as computer equipment. An example of one such rack 800 is illustrated in FIG. 8. As described in more detail below, the length of the rackmount assembly 100 is continuously, rather than incrementally, adjustable for use with racks having any depth.

As shown in the assembled and unassembled views in FIGS. 1 and 2, respectively, the rackmount assembly 100 includes a first support member 110 that is secured or locked adjacent to a second support member 120 by a key 130. For the reasons discussed below, the key 130 is also referred to as a "locking key," or "lock." Although the first and second support members are illustrated in the figures as journal bearing slides, they mail also be provided with roller bearings and/or be configured as non-sliding rails. Each of the first and second support members 110, 120 includes a flange 150 for securing to a vertical support member such as a shelf in the rack 800 shown in FIG. 8. However, brackets may be alternatively provided.

The first support member 110 and the second support member 120 are preferably arranged to slide along their longitudinal axes in order to accommodate various distances between vertical support members. In this regard, the first support member 110 and/or second support member 120 may be provided with one or more shoulders 160 on one, or both, side edges for guiding the sliding motion between the first support member and the second support member. Although these figures illustrate the second support member 120 sliding inside the first support member 110, the positions of the first and second support members may be reversed and/or the second support member 120 may be rotated 180 degrees relative to the first support member 110.

Turning now to FIG. 2, the first support member 110, includes a variety of first slots 112 arranged along the longitudinal, or sliding, axis of the first support member 110. The first slots 112 may also be displaced from the longitudinal axis of the first support member 110. However, they preferably extend substantially parallel to the longitudinal axis in order to accommodate the sliding motion as described in more detail below. The first slots 112 may also be joined together in one or more longer slots.

The second support member 120 includes several second slots 122 which are aligned with the first slots 112 when the first support member 110 and the second support member 120 are arranged adjacent to each other. Although FIGS. 1 and 2 illustrate the first support member 110 and the second support member 120 engaging each other in their adjacent positions, various other structures may be provided between, and separate, the first and second support members.

As best illustrated in the partial, isometric back view of the second support member 120 shown in FIG. 3, each second slot 122 in the second support member 120 is also provided with a locking tab 124 or a guiding tab 125 that extend over the second corresponding second slot. Although the tabs 124 and 125 are illustrated as extending into the slots 122 from one end, the tabs may also be displaced from the surface of the second support member 120 and/or may be arranged at the other end of the slots 122. Each of the tabs 124 and 125 is also be provided with an optional boss 126 for stiffening the tab against bending stresses. The boss 126 may be arranged to fit between the ears 134.

As illustrated in FIGS. 2 and 3, the locking tabs 124 are preferably arranged with the second slots 122 toward one end of the second support member 120 while the guiding tabs 125 are arranged toward the other end of the second support member. However, the positions of the locking tabs 124 and guiding tabs 125 may also be reversed. Each of the tabs 124 and 125 is provided with a narrow tip portion 128 arranged in order to facilitate insertion of the tab into the key 130 as described in more detail below.

In addition to the narrow tip 128 of the locking tabs 124 is further provided with at least one catch 129 for inhibiting the release of the key 130 once it is mounted on the tab 124. The catch 129 is formed by bending, or otherwise configuring, one or more side edges of the tip 128 substantially perpendicular to back surface of the tab 124 so that the catch will abut the ears 134 of the key 130 as described in more detail below. Prior to bending or otherwise deforming the side edges of the locking tabs 124, the locking tabs are preferably provided with short cuts 1291 to form catch surfaces that extend from the back side of the tabs 124 and catch on the edges of the ears 134.

Various details of one embodiment of the key 130 will now be further described with reference to FIGS. 4–7. The key 130 may be stamped or otherwise formed in one-piece from a sheet of metal, plastic, and/or other material. For example, spring stainless steel may be used. A variety of forming, annealing, hardening, and/or plating techniques may also be applied to the key 130 in order to provide appropriate physical and/or aesthetic characteristics. However, the key 130 may also be molded or machined from a variety of these, and/or other, materials, and may also be constructed in any number of pieces. Any such pieces may later be joined or otherwise assembly into a unitary assembly. Alternatively, the key 130 may be implemented in multiple separate pieces with the rackmount assembly 100.

The illustrated key 130 includes a main body, or torso, 131 that optionally includes several torso embosses 132 for stiffening the torso while, at the same time, possibly providing various aesthetic effects. For example, generally arrow-shaped embosses 132 may be provided for showing the direction of movement of the key as described in more detail below. Alternatively, a product name, product number, weight capacity, and/or company logo may be provided on the key 130. The embosses 132 may also be supplemented and/or replaced with hole for minimizing the weight of the key and/or assisting with handling. For example, the arrow-shaped embossed may be replaced with corresponding holes for receiving a user's thumb and forefinger. However, a variety of other embossing and/or hole designs may also be provided.

A head 133 extends downwards from each end of the torso 131. Each head 133 includes ears 134 for engaging the tabs 124 and 125 as described in more detail below. Arms 135 also extend downward from the torso 131 near each of the heads 133 for supporting the torso 131 over the first support member 110, as best illustrated in FIGS. 1 and 2. The arms also provide resiliency for when the key 130 is pressed against the first support member 110 during assembly. As the key is depressed against the surface of the first support member 110 as shown in FIG. 2, the arms 135 will flex outward, allowing the torso 131 to move closer to the first support member. When the key 130 is released, the torso 131 and attached head 133 will spring back so that the ears 134 press toward and/or against the backside of the 124 and/or 125.

The ends of the arms 135 are further provided with hands 136 for abutting the front side of the first support member 110 and stabilizing the arms 135 on the first support member. The hands 136 may be further provided with embossed dimples 137 for minimizing the surface area of the hands 136 that contacts the first support member 110. The dimples 137 also raise the edges of the hands 136 away from the surface of the first support member 110 in order to prevent scratching, or other frictional resistance, against the first support member when the key 130 is depressed against the first support member 110.

Although the key 130 is illustrated in the figures as having two heads 133, each with two ears 134, a different number of heads and/or ears may be provided. For example, the head 133 at one end of the torso 131 may be provided with a single ear 134 on one side of the head while the head at the other end of the torso is provided with a single ear on an opposite side of the head. One or more of the ears 134 may also extend outward from the key 130 in order to abut the side edges of the second longitudinal slots 122. In the latter case, the side edges of the longitudinal slots may be provided with catches 129.

The first slots 112 may also be joined together in one or more longer slots. Similarly, although two pairs of arms 135, each having a hand 134 are shown in the figures, a different number of arms and/or hands may be provided. For example, a single arm 135 may be provided on one side of one end of the torso 131, while another arm is provided on an opposite end and opposite side of the torso. In addition, the arrangement of the heads 133 and/or arms 135 may be varied. For example, an additional set of arms may be arranged near the center of the torso 131 for supplementing and/or replacing the arms 135 that are illustrated in the drawings.

Returning to FIGS. 1 through 3, the illustrated embodiment of the rackmount assembly 100 is assembled by arranging the first support member 110 beside and/or against the second support member 120 with one of the second slots 122 aligned with one of the first slots 112 and an adjacent one of the second slots 122 aligned with adjacent first slot 112. Once the first and second support members 110 and 120 are properly aligned, the head 133 of the key 130 is inserted through the first slot 112 so that the corresponding ears 134 engage are aligned with the back side of the tabs 124 and 125.

The key 130 may be arranged in one of two positions illustrated, respectively, by the set of long dashed lines and the set of short dashed lines shown in FIG. 2. In each case, one of the heads 130 will be preferably engaged with a guiding tab 125 while the other head will be engaged with a locking tab 124. However, as noted above, a different number, assortment, order, and/or arrangement of locking tabs 125 and guiding tabs 125 may also be provided. For example, all of the tabs 124 and 125 may be arranged with locking catches 129 so that both heads 133 will abut a catch. Similarly, the tabs may be provided without catches 129.

Once in position, the key 130 is then further depressed against the resiliency of the arms 135. The ears 134 in one, or both, of the heads 133 will then extend past the back side of corresponding tabs 124 and 125. The key 130 can then be slid over the tabs 124 and 125 toward the end of the corresponding second slots 122. One of the heads will then snap over the catch 129 on the locking tab 124 in order to lock, or otherwise secure, the key 130 on the locking tab 124.

In this position, once the key 130 is released, the arms 135 and/or hands 136 will urge the key 130 away from the tabs 124 and 125 so as to urge together the first support member 110 and the second support member 120. In this way, the key 130 will remain secured to the tabs 124 and 125, while the first and second support members 110 and 120 are slid longitudinally relative to each other. After a certain amount of sliding, the key 130 will abut the ends of one or more of the first slots 112 and then may be removed and reconfigured in the next pair of first slots 112 in order to provide further extension of the rackmount assembly 100.

The distance between the heads 133 is preferably twice the distance between the second slots 122 and twice the distance between adjacent ends of the first slots 112. In this configuration, the position of the second support member 120 is continuously adjustable to almost any location along the length of the first support member 110. These relative dimensions allow the rackmount assembly 100 to be used with a variety of racks having a wide range of depths between columns. For example, the rackmount assembly 100 may be easily configured to work with shallower racks (having a shorter dimension from front to back) than the rack 800 shown in FIG. 8.

Turning to FIG. 8, the illustrated rack 800 is provided with base 801 and several columns 802 extending from the base. The rackmount assembly 100 is secured between two of the columns 802. More specifically, each of the brackets 150 is secured to one of the columns, either before, or after, the first support member 110 and second support member 112 are secured with the key 130. The rackmount assemblies 100 on each side of the rack 800 can therefore be used to provide support for various components including, but not limited to, trays, drawers, and/or other components.

As discussed above, the position of the first support member 110 with respect to the second support member 112 is easily and continuously adjustable in infinitesimally small increments. Using only four first slots 110 and four second slots 120, the rackmount assembly 100 can therefore be adjusted for racks having a wide variety of different depths. The rackmount assembly 100 is also quick and easy to assemble, without the aid of tools, from just one side of the support members 110 and 120. In addition, the key 130 may be formed in one piece and/or with a symmetrical shape so as to make it physically and intuitively simple to install. When the support members 110 and/or 120 are provided with shoulders 160, the key 130 can be engineered with a relatively low shearing capacity.

It should be emphasized that any embodiments described above, and particularly, any preferred embodiments, are merely examples of various implementations that have been set forth here to provide an understanding of various aspects of the invention. One of ordinary skill will be able to alter many of these embodiments without substantially departing from the scope of protection defined solely by the proper construction of the following claims.

What is claimed is:

1. An adjustable rackmount assembly, comprising:
   a first support member having a plurality of first longitudinal slots;
   a second support member having a plurality of second longitudinal slots;
   a longitudinally-extending tab arranged in each of the second longitudinal slots; and
   a key for engaging one of the tabs and securing the first support member adjacent to the second support member.

2. The assembly recited in claim 1, wherein said key further comprises:
   a torso; and
   a head, extending from the torso and through one of the first longitudinal slots, for engaging the one tab.

3. The assembly recited in claim 2, wherein the head further comprises at least one ear for abutting a surface of the one tab that faces away from the first support member.

4. The assembly recited in claim 2, wherein the key further comprises a pair of arms extending from each side of the torso for supporting the torso over the first support member.

5. The assembly recited in claim 3, wherein the key further comprises a pair of arms extending from each side of the torso for supporting the torso over the first support member.

6. The assembly recited in claim 4, wherein the key further comprises a hand, extending from each arm, for abutting a surface of the first support member that faces away from the second support member.

7. The assembly recited in claim 5, wherein the key further comprises a hand, extending from each arm, for abutting a surface of the first support member that faces away from the second support member.

8. The assembly recited in claim 2, wherein the key further comprises a second head extending from the end of the torso that is opposite from the first head.

9. The assembly recited in claim 5, wherein the key further comprises a second head extending from the end of the torso that is opposite from the first head.

10. The assembly recited in claim 6, wherein the key further comprises a second head extending from the end of the torso that is opposite from the first head.

11. The assembly recited in claim 7, wherein the key further comprises a second head extending from the end of the torso that is opposite from the first head.

12. A key for securing a first support member adjacent to second support member of an adjustable rackmount assembly, said key comprising:
- a torso;
- at least one pair of arms, extending from each side torso, for supporting the torso over the first support member; and
- at least one head, extending from an end of the torso, for slidably engaging the second support member through a hole in the first support member.

13. The key recited in claim 12, wherein said at least one head further comprises a pair of ears for abutting a surface of the second support member that faces away from the first support member.

14. The key recited in claim 12, further comprising a hand, arranged on an end of each of the arms, for abutting a surface of the first support member that faces away from the second support member.

15. The key recited in claim 13, further comprising a hand, arranged on an end of each of the arms, for abutting a surface of the first support member that faces away from the second support member.

16. The key recited in claim 12, wherein said at least one head comprises at least two heads of the torso, and said at least one pair of arms comprises at least two pair of arms arranged on opposite ends of the torso.

17. The key recited in claim 13, wherein said at least one head comprises at least two heads of the torso, and said at least one pair of arms comprises at least two pair of arms arranged on opposite ends of the torso.

18. The key recited in claim 14, wherein said at least one head comprises at least two heads of the torso, and said at least one pair of arms comprises at least two pair of arms arranged on opposite ends of the torso.

19. The key recited in claim 15, wherein said at least one head comprises at least two heads of the torso, and said at least one pair of arms comprises at least two pair of arms arranged on opposite ends of the torso.

20. A rack, comprising:
- a base;
- at least two columns extending from the base;
- a first support member, having a plurality of first longitudinal slots, extending from one of the two columns;
- a second support member, having a plurality of second longitudinal slots, extending from another of the two columns;
- a tab extending from one end and into each of the longitudinal slots, at least one of the tabs including a catch;
- a key for securing the first support member adjacent to the second support member, said key further comprising:
  - a torso;
  - two heads, each extending from opposite ends of the torso and through adjacent first longitudinal slots, for slidably engaging tabs in adjacent second longitudinal slots;
  - two pairs of arms, for supporting the torso over the first support member, each pair of arms arranged near opposite ends of the torso and each arm in one of the pairs extending from opposite sides of the torso; and
  - a hand, arranged at the end of each arm, for abutting a surface of the first support member that faces away from the second support member.

* * * * *